United States Patent
Han et al.

(10) Patent No.: US 7,727,788 B2
(45) Date of Patent: Jun. 1, 2010

(54) METHOD OF MANUFACTURING DISPLAY DEVICE USING LED CHIPS FORMED IN A POROUS TEMPLATE

(75) Inventors: In-Taek Han, Seoul (KR); Jong-Min Kim, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 558 days.

(21) Appl. No.: 11/407,335

(22) Filed: Apr. 20, 2006

(65) Prior Publication Data

US 2007/0224713 A1    Sep. 27, 2007

(30) Foreign Application Priority Data

Mar. 21, 2006    (KR) .................. 10-2006-0025673

(51) Int. Cl.
*H01L 21/00*    (2006.01)
(52) U.S. Cl. ............... 438/30; 438/34; 438/47; 257/E21.085; 257/E21.114; 977/883; 977/949
(58) Field of Classification Search .......... 977/882, 977/883, 949; 438/24–28, 34–36, 42–47, 438/110, 125, FOR. 417, 30, 492, 780, 781, 438/932, 949, 950, 763; 257/81, 82, 91, 257/98–100, 116, 117, 432–437, E33.056–E33.059, 257/E25.032, 103, E21.04, E21.042, E21.044, 257/E21.056, E21.055, E21.114, E21.119, 257/88, 94, E21.085

See application file for complete search history.

(56) References Cited

U.S. PATENT DOCUMENTS

| | | | |
|---|---|---|---|
| 5,904,545 A * | 5/1999 | Smith et al. ............... | 438/455 |
| 6,139,626 A * | 10/2000 | Norris et al. .............. | 428/323 |
| 6,709,929 B2 * | 3/2004 | Zhang et al. .............. | 438/268 |
| 6,927,382 B2 * | 8/2005 | King et al. ............... | 250/214.1 |
| 7,070,851 B2 * | 7/2006 | Jacobsen et al. .......... | 428/209 |
| 7,183,127 B2 * | 2/2007 | Kuriyama et al. .......... | 438/34 |
| 2002/0013008 A1 * | 1/2002 | Sanaka et al. ............ | 438/15 |
| 2003/0010971 A1 * | 1/2003 | Zhang et al. ............. | 257/15 |
| 2004/0033339 A1 * | 2/2004 | Fukutani et al. .......... | 428/137 |
| 2004/0157354 A1 * | 8/2004 | Kuriyama et al. ......... | 438/45 |

(Continued)

FOREIGN PATENT DOCUMENTS

JP        7-221343        8/1995

(Continued)

OTHER PUBLICATIONS

Korean Office action corresponding to Korean Patent Application No. 10-2006-0025673, issued on Apr. 20, 2007.

*Primary Examiner*—Matthew C Landau
*Assistant Examiner*—Joseph C Nicely
(74) *Attorney, Agent, or Firm*—Robert E. Bushnell, Esq.

(57) ABSTRACT

A method for manufacturing a display device using light emitting diode chips contemplates manufacturing a plurality of light emitting diode (LED) chips using a porous template; forming a plurality of first electrodes on a substrate; attaching the LED chips to pixel sites on the first electrodes using fluidic self assembly (FSA); and forming a plurality of second electrodes on a top surface of the LED chips.

18 Claims, 6 Drawing Sheets

U.S. PATENT DOCUMENTS

2004/0222357 A1* 11/2004 King et al. ............... 250/214.1
2005/0009303 A1* 1/2005 Schatz ....................... 438/466
2005/0042743 A1* 2/2005 Kawai et al. ............. 435/287.2
2005/0158651 A1* 7/2005 Ryu et al. .................. 430/141
2005/0224830 A1* 10/2005 Blonder et al. .............. 257/100
2006/0032329 A1* 2/2006 Rubinstein et al. ............ 75/255
2007/0128808 A1* 6/2007 Choi et al. .................. 438/270
2008/0254601 A1* 10/2008 Terry et al. ................. 438/502

FOREIGN PATENT DOCUMENTS

JP          8-274375     10/1996
SU          525913 A  * 12/1976

* cited by examiner

METHOD OF MANUFACTURING DISPLAY DEVICE USING LED CHIPS FORMED IN A POROUS TEMPLATE

CLAIM OF PRIORITY

This application makes reference to, incorporates the same herein, and claims all benefits accruing under 35 U.S.C. §119 from an application earlier filed in the Korean Intellectual Property Office on Mar. 21, 2006 and there duly assigned Serial No. 10-2006-0025673.

BACKGROUND OF THE INVENTION

1. Field of the Invention

The present invention relates to a method of manufacturing a display device, and more particularly, to a method of simplifying the manufacture of display devices using light emitting diode (LED) chips while reducing the costs of manufacture.

2. Description of the Related Art

Light emitting diodes (LEDs) are devices which transform electric energy into light. LEDs are used in illumination, as backlighting units in liquid crystal displays (a LCD), and in display devices projecting variable visual images to viewers, as for example, in a video display device such as a monitor.

Display devices using LED chips are constructed with numerous LED chips arranged in a predetermined form on an electrode of a substrate; the chips form a visible image formed with light from predetermined colors such as red (R), green (G), and blue (B) which are emitted from the LED chips. In these display devices the LED chips have a structure in which an impurity-doped compound semiconductor layer is stacked. In the prior art, one method for the manufacture of LED chips grows a compound semiconductor layer on an electrode of a substrate by using metal organic chemical vapor deposition (MOCVD). In this method however, manufacturing costs are high, yield is low, and high process temperatures are required.

SUMMARY OF THE INVENTION

It is therefore, an object of the present invention to provide an improved method for manufacturing display devices using light emitting diode (LED) chips.

It is another object to simplify the method for manufacturing display devices using light emitting diode (LED) chips.

It is still another object to provide a less expensive method for the manufacture of display devices using light emitting diode (LED) chips.

These and other objects may be attained according to the principles of the present invention to manufacture display devices that use light emitting diode (LED) chips more simply, at lower costs by manufacturing the LED chips with a porous template.

According to an aspect of the present invention, there is provided a method for manufacturing display devices which contemplates manufacturing a plurality of light emitting diode (LED) chips by using a porous template; forming a plurality of first electrodes on a substrate; attaching the LED chips to pixel sites on the first electrodes through fluidic self assembly (FSA); and forming a plurality of second electrodes on top surfaces of the LED chips.

The manufacturing of the LED chips may include a preparation of the porous template in which pores having a predetermined size are formed; stacking impurity-doped compound semiconductor layers inside the respective pores and sintering the combination in order to form the LED chips; hydrophilically treating the surface of the porous template on the end of the LED chips which is exposed; and removing the porous template with an application of a predetermined solution in order to leaving only the LED chips.

The diameter of the pores may be within a range of approximately 1 nanometer (nm) to approximately 100 micrometer ($\mu$m). Compound semiconductor layers may be formed of quantum dots in which either nano particles or nano particle precursors are injected into the pores together with impurities.

The porous template maybe formed from either anodized aluminum oxide or porous glass fiber. A solution used to remove the porous template maybe a buffered oxide etchant (BOE).

After forming the first electrodes on the substrate, the method may further include the steps of hydrophobically treating the pixel sites on the first electrodes, and applying an adhesive to the hydrophobically treated pixel sites. The adhesive may be applied to the pixel sites of the first electrodes when the substrate on which the first electrodes are formed, is soaked in a hydrophobic adhesive solution.

The attachment of the LED chips through fluidic self assembly (FSA) may include the steps of submerging the substrate on which the first electrodes are formed and submerging the LED chips in an aqueous solution held within a container, and vibrating the container to attach one end of the LED chips having a hydrophobic property to the pixel sites on the first electrodes to which the adhesive is applied. The method may further include thermally pressurizing the LED chips attached to the pixel sites on the first electrodes.

After attaching the LED chips, the method may further include steps for repairing the pixel sites of the first electrodes to which the LED chips are not attached. The repair of the pixel sites may include repeatedly performing FSA or separately attaching the LED chips to each of the pixel sites on the first electrodes to which the LED chips are not attached.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein FIGS. 1 through 12 illustrate a method for manufacturing a display device by using light emitting diode (LED) chips according to the principles of the present invention, in which:

FIG. 1 illustrates a porous template that has been prepared with a plurality of pores;

FIG. 2 illustrates impurity-doped compound semiconductor layers;

FIG. 3 illustrates a hydrophilic treatment of LED chips;

FIG. 4 illustrates the removal by etching of a porous template submerged within a bath of a buffered oxide etchant;

FIG. 5, illustrates the formation of electrodes on a substrate;

FIG. 6 illustrates the formation and hydrophobic treatment of pixel sites on one surface of the first electrodes formed on the substrate;

FIG. 7 illustrates the application of an adhesive to the hydrophobically treated pixel sites;

FIG. 8 is a cross-sectional view of the substrate taken along sectional line VIII-VIII' of FIG. 7, to show the first electrodes and the adhesive applied to hydrophobically treated pixel sites;

FIG. 9 is a cross-sectional view showing the substrate bearing the first electrodes and the LED chips submerged in a container of an aqueous solution during a fluidic self assembly process;

FIG. 10 is a cross-sectional view showing the LED chips that became attached to the pixel sites on the first electrodes to which the adhesive had been applied, during the process illustrated by FIG. 9;

FIG. 11 is an oblique view illustrating the spaced-apart LED chips that have become attached to corresponding pixel sites on the first electrodes, to form an uniform array, and FIG. 12 is an oblique view showing a plurality of second electrodes formed on the top surfaces of the LED chips.

DETAILED DESCRIPTION OF THE INVENTION

Figure 1:
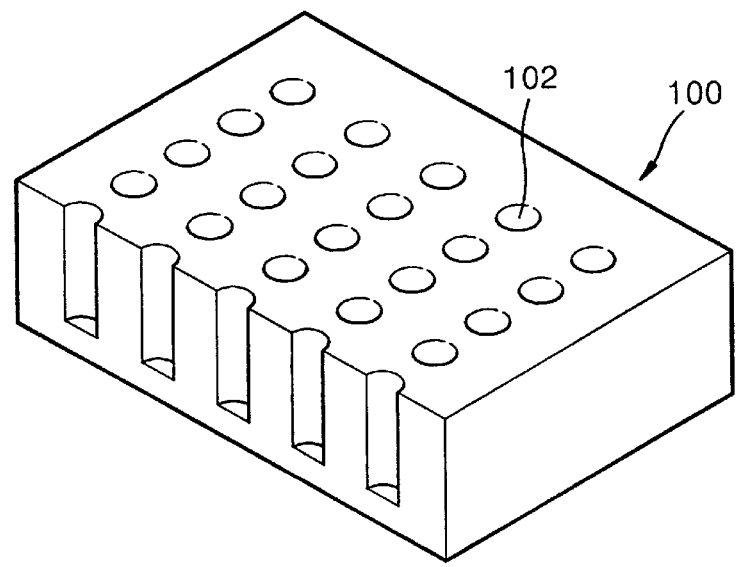

The present invention will now be described more fully with reference to the accompanying drawings, in which an exemplary embodiment of the invention are shown. Like reference numerals in the drawings denote like elements.

FIGS. 1 through 12 illustrate a method of manufacturing a display device using light emitting diode (LED) chips according to an embodiment of the present invention. FIGS. 1 through 4 illustrate a process of manufacturing LED chips.

Referring now to FIG. 1, a porous template 100 is prepared in which pores 102 (e.g., blind holes opening on one major surface of template 100) with predetermined cross-sectional dimensions and depths are formed. Here, porous template 100 may be formed from anodized aluminum oxide or porous glass fiber, etc. The size of pores 102 may be set to different dimensions according to conform with the size of the LED chips. For example, pores 102 may have a diameter within a range of about 1 nm to about 100 μm.

Figure 2:
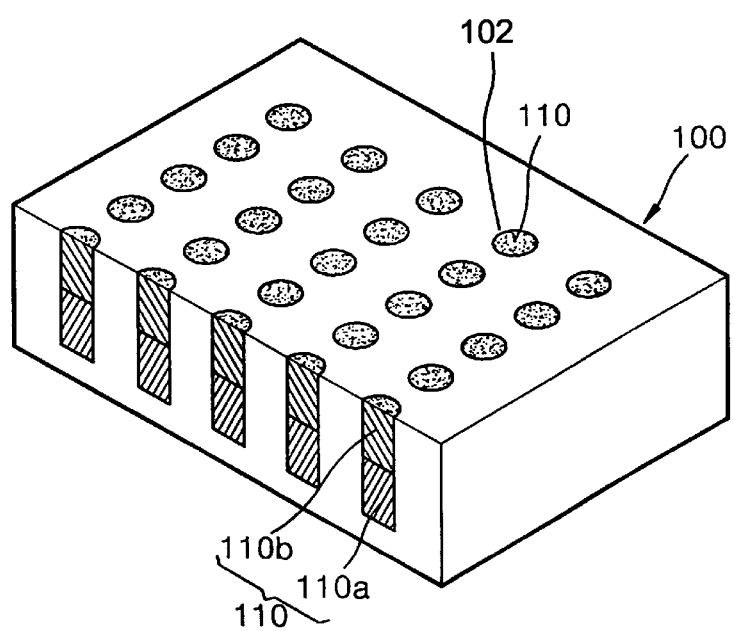

Referring to FIG. 2, impurity-doped compound semiconductor layers 110a and 110b, for example, a p-type compound semiconductor layer 110a and an n-type compound semiconductor layer 110b, are stacked inside corresponding pores 102, and then are sintered, thereby forming LED chips 110. LED chips 110 may be used to form pixels of a display device. In order to implement an image having high resolution, LED chips 110 can be manufactured to a nano size. In order to manufacture LED chips 110 having the nano size, pores 102 having a diameter of the nano size (e.g., within a range of approximately 1 nanometer (nm) to approximately 100 micrometer (μm)) are formed in porous template 100 and nano particles or nano particle precursors are injected into pores 102 together with impurities. As a result, compound semiconductor layers 110a and 110b can be formed of p-type and n-type quantum dots.

Figure 3:
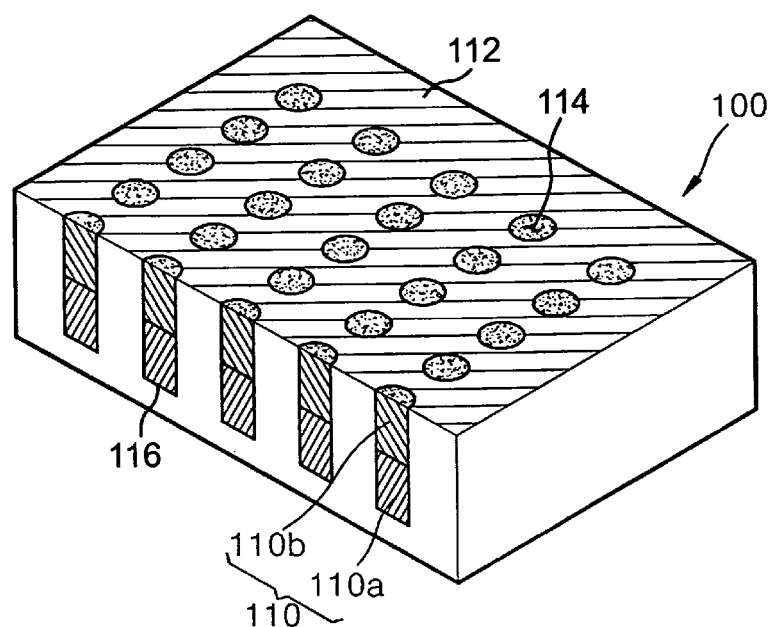

Referring to FIG. 3, surface 112 of porous template 100 in which LED chips 110 are formed inside pores 102, is hydrophilically treated. Here, one end 114 of LED chips 110, that is, a top surface of n-type compound semiconductor layer 110b shown in FIG. 3, is exposed on surface 112 of hydrophilically treated porous template 100. As a result, top surface 114 of n-type compound semiconductor layer 110b has a hydrophilic property, and a bottom surface 116 of p-type compound semiconductor layer 110a has a hydrophobic property.

Figure 4:
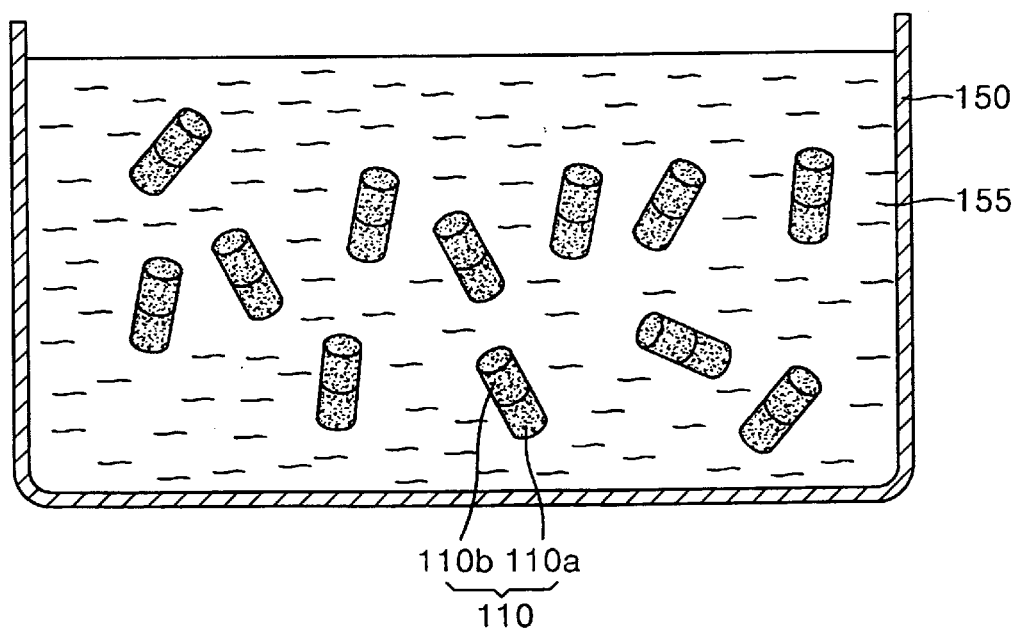

Referring to FIG. 4, when porous template 100 is inserted into a container 150 in which a predetermined solution 155 is held, porous template 100 is removed by solution 155 and only LED chips 110 remain within solution 155. Here, a buffered oxide etchant (BOE) may be included in solution 155 which is used to remove porous template 100.

FIGS. 5 through 8 illustrate a process of forming a plurality of first electrodes 202 on a substrate 200.

Figure 5:
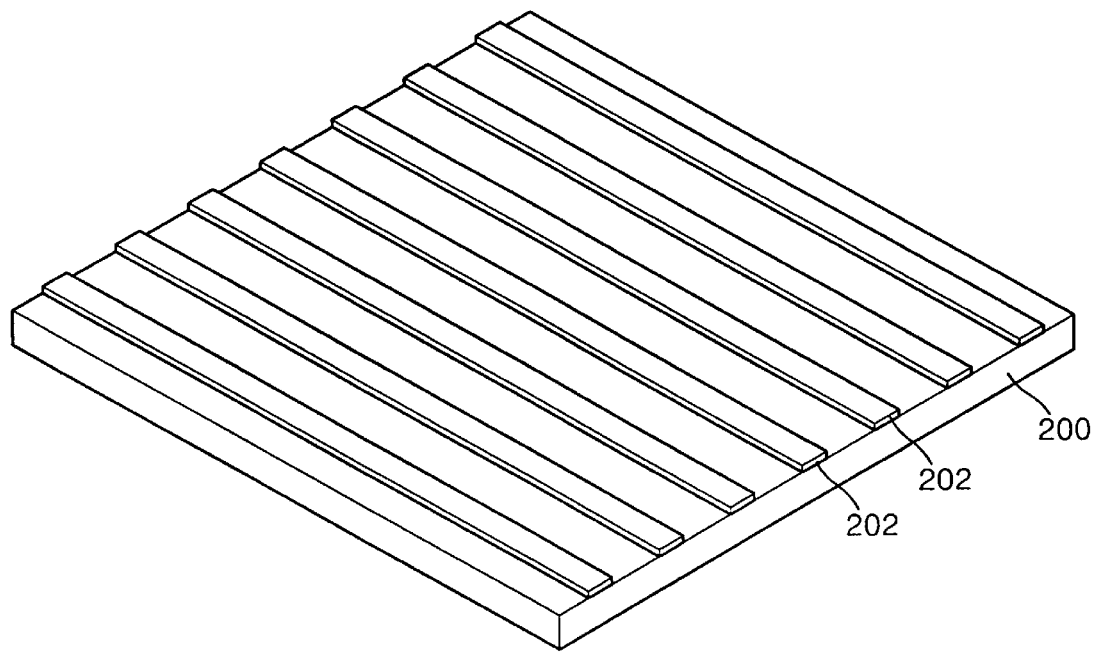

Referring to FIG. 5, first electrodes 202 are formed on substrate 200. A transparent glass substrate or a plastic substrate may be used for substrate 200. A conductive material is applied on substrate 200 and then patterned in a predetermined form, thereby forming first electrodes 202. Here, first electrodes 202 may be formed in longitudinally extended shapes as a plurality of spaced-apart stripes. First electrodes 202 may be formed of a transparent conductive material such as indium tin oxide (ITO). Although not shown, grooves having a predetermined depth may also be formed at the locations on first electrodes 202 corresponding to pixels sites of substrate 200 so that LED chips 110 can be more easily attached to first electrodes 202.

Figure 6:
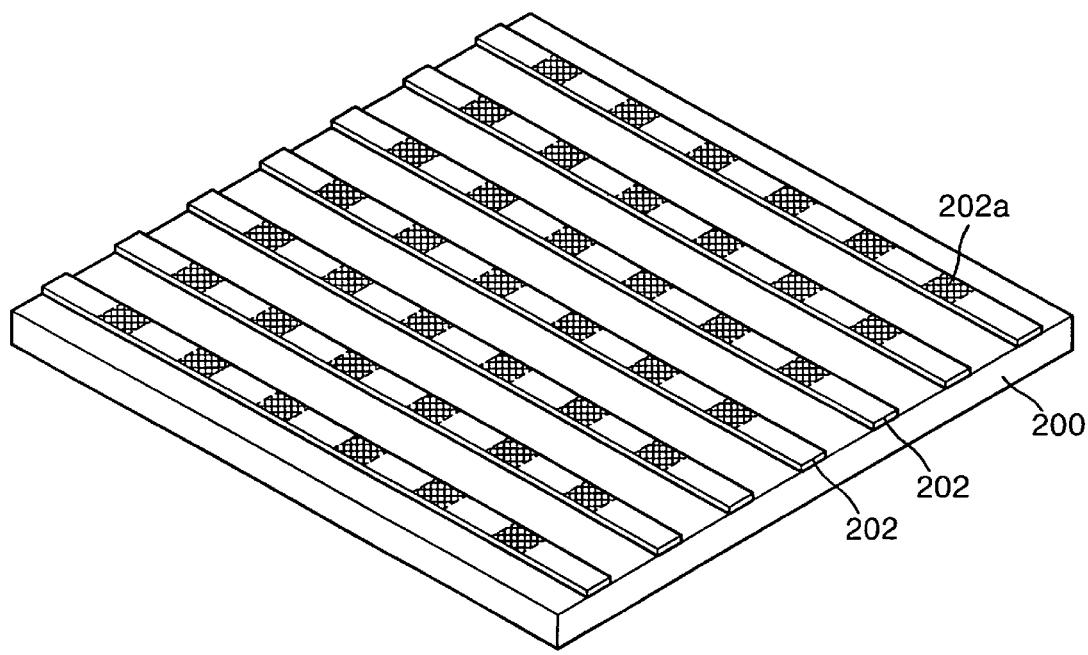

Referring to FIG. 6, pixel sites 202a formed in a generally ordered array at spaced-apart sites on the surface of first electrodes 202 which had been formed on one major surface of substrate 200, are hydrophobically treated.

Figure 7:
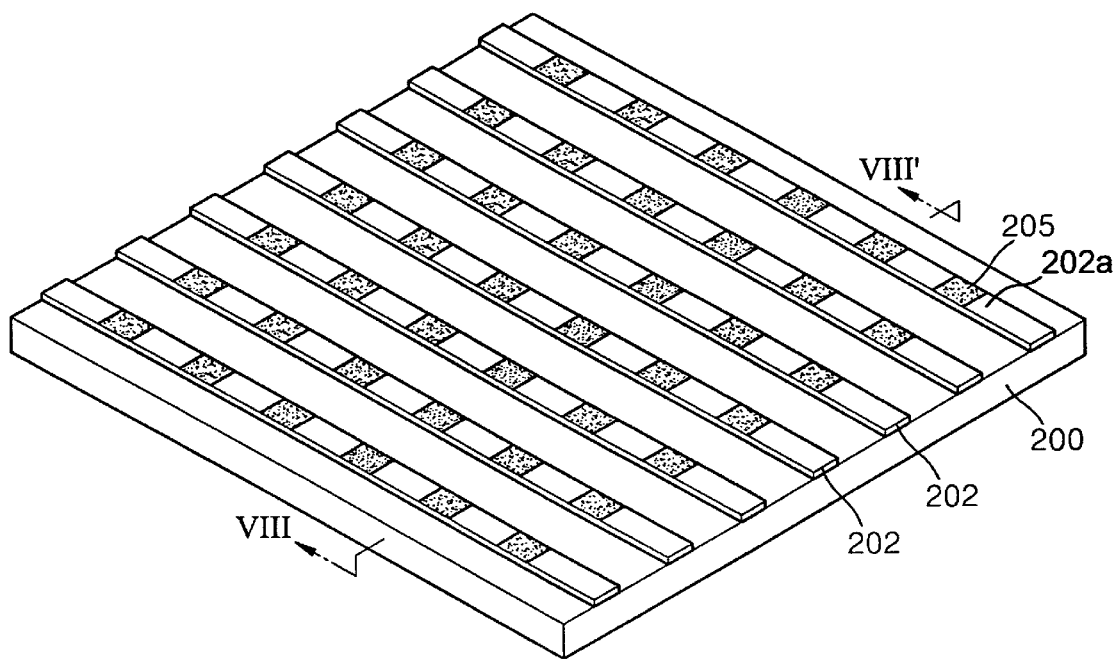
Figure 8:
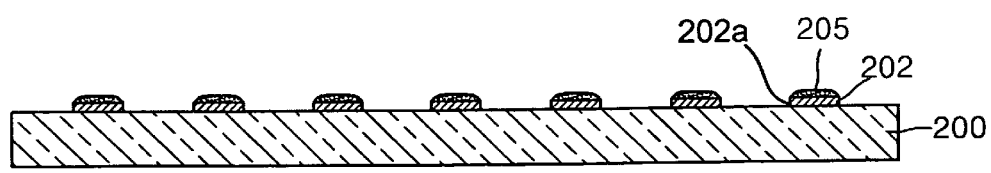

Referring to FIG. 7, an adhesive 205 is applied to hydrophobically treated pixel sites 202a. Specifically, substrate 200 on which first electrodes 202 are formed is soaked in a hydrophobic adhesive solution, adhesive 205 is attached to hydrophobically treated pixel sites 202a on first electrodes 202. FIG. 8 is a cross-sectional view of substrate 200 taken along sectional line VIII-VIII' of FIG. 7, to show first electrodes 200 and adhesive 205 applied to hydrophobically treated pixel sites 202a.

Figure 9:
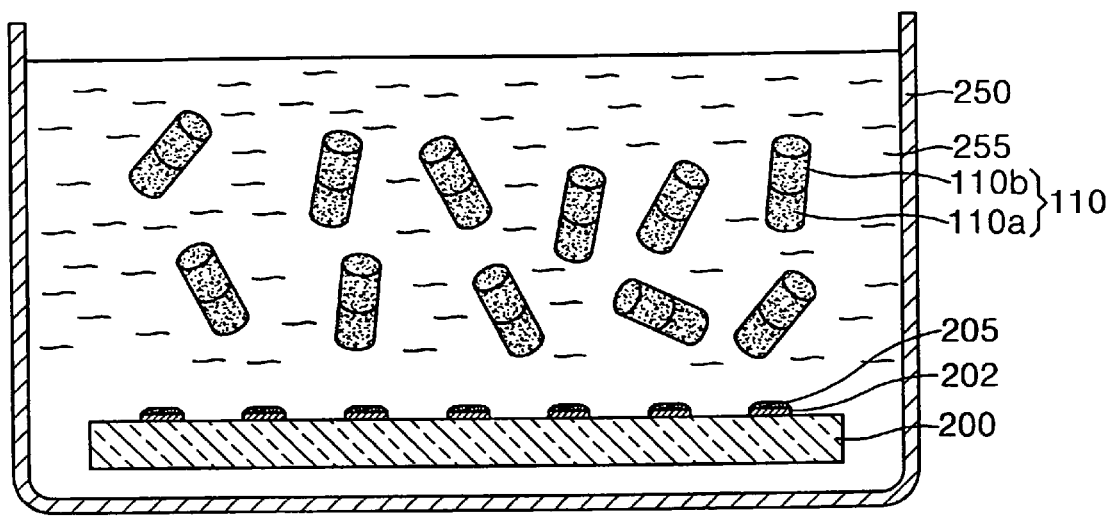
Figure 10:
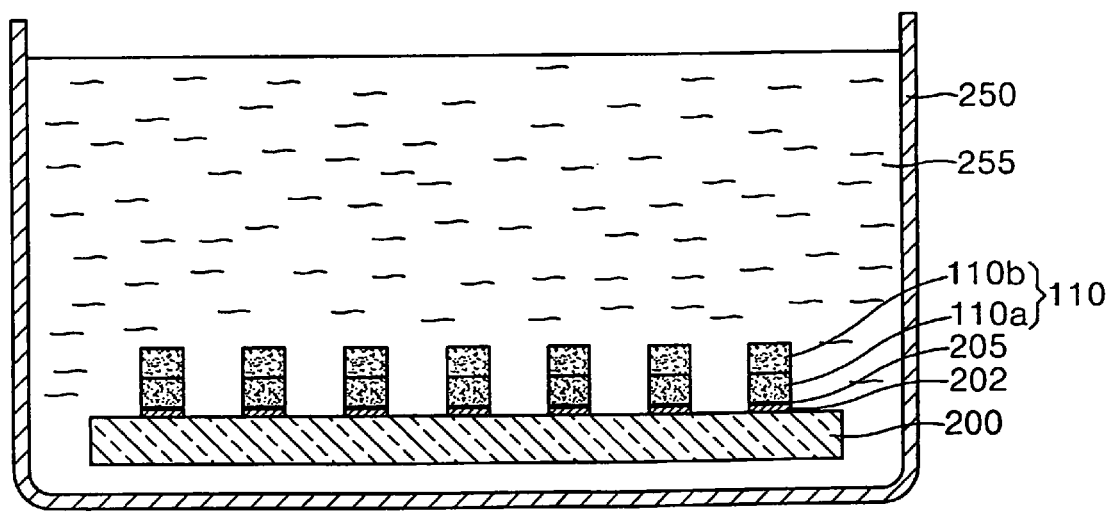
Figure 11:
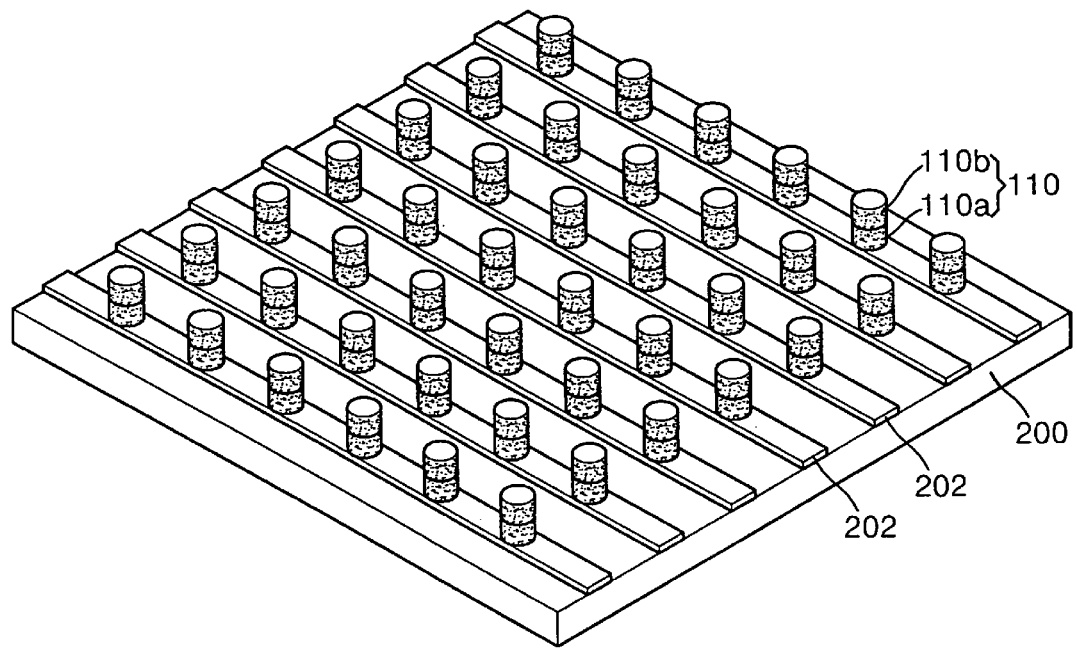

FIGS. 9 through 11 illustrate a process of attaching LED chips 110 to pixel sites 202a on first electrodes 202 by using a fluidic self assembly (FSA) process.

Referring first to FIG. 9, substrate 200 on which first electrodes 202 have been formed as well as LED chips 110 are inserted, as a first step in the fluidic self assembly (FSA) process, into container 250 holding an aqueous solution 255. As is illustrated in FIG. 10, when container 250 is vibrated by such techniques as the application, by way of example, of ultrasonic waves, or other sources of cyclical forces to container 250, LED chips 110 are moved due to the resulting vibrations, and one base end of the generally cylindrically shaped LED chips 110 become attached to pixel sites 202a on first electrodes 202 to which adhesive 205 has been applied. Here, since the base end of LED chips 110, that is, the bottom or base surfaces of p-type semiconductor layers 110a of LED chips 110, have a hydrophobic property, the bottom surfaces of p-type semiconductor layer 110a are attached to pixel sites 202a which have a hydrophobic property. LED chips 110 can be easily aligned in pixel sites 202a on first electrodes 202 using FSA. FIG. 11 is an oblique view illustrating the case where LED chips 110 have become spaced-apart and attached in a uniform array to all of their corresponding pixel sites 202a on first electrodes 202 by using this fluidic self assembly (FSA) process. If, after LED chips 110 have become attached to pixel sites 202a as illustrated by FIG. 11, LED chips 110 are subsequently subjected to thermally pressurization, LED chips 110 will be even more securely attached to pixel sites 202a.

After the fluidic self assembly (FSA) process has been performed, there is a possibility that some of pixel sites 202a to which LED chips 110 are not attached may exist on first electrodes 202. In this case, a repair process may be performed. This repair process may include a process of repeatedly performing the fluidic self assembly (FSA) process or, alternatively, a process of individually attaching LED chips 110 to those pixel sites 202a to which no LED chip 110 has yet become attached.

Figure 12:
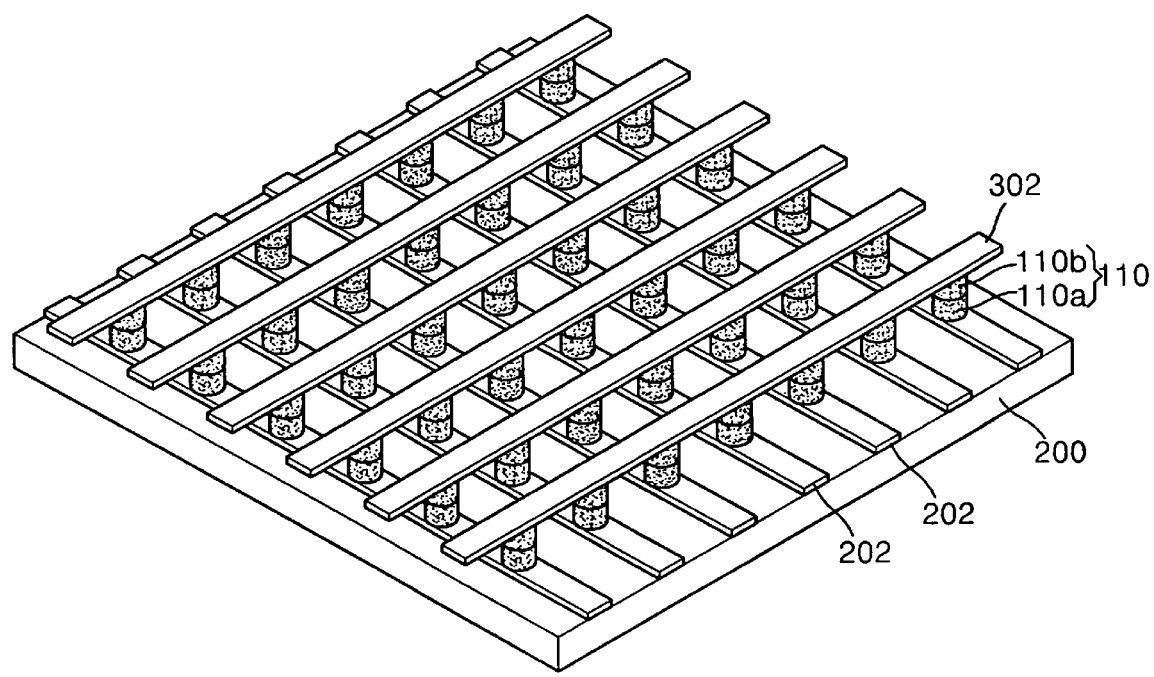

Referring now to FIG. 12, when a plurality of generally uniformly spaced-apart second electrodes 302 are formed on the base, or top surface, of LED chips 110, that is, on the top surface of n-type compound semiconductor layer 110b, a display device is completed. Here, second electrodes 302 may obliquely, or perpendicularly cross first electrodes 202. Second electrodes 302 may be formed in the shapes of longitudinal extended stripes, like first electrodes 202. Second electrodes 302 may be formed of a transparent conductive material such as an indium tin oxide (i.e., ITO thin film).

As described in the foregoing paragraphs, p-type compound semiconductor layer 110a is located in a lower portion of LED chips 110 and n-type compound semiconductor layer 110b is located in an upper portion of LED chips 110.

According to the principles of the present invention incorporated into the practice of the current embodiment of the present invention, p-type compound semiconductor layer 110a may be located in the upper portion of LED chips 110 and n-type compound semiconductor layer 110b may be located in the lower portion of LED chips 110.

As described above, according to the principles of the present invention, the unit cost of LED chips which are manufactured by using the porous template is substantially reduced, yield is markedly improved, and the manufacturing process is able to be performed at room temperature. In addition, when the LED chips are formed by stacking quantum dots having a nano size, display devices can be manufactured that are able to project an image having a noticeable higher resolution. The LED chips are aligned on the first electrodes using FSA so that display devices having a larger size may be manufactured in a simplified process.

While the present invention has been particularly shown and described with reference to an exemplary embodiment thereof, it will be understood by those skilled in the art that various changes in form and details may be made therein without departing from the spirit and scope of the invention as defined by the following claims.

What is claimed is:

1. A method of manufacturing a display device, the method comprising:
   preparing a porous template by forming an array of pores having predetermined sizes in the porous template;
   stacking impurity-doped compound semiconductor layers inside corresponding ones of the pores in the porous template and sintering the semiconductor layers to form a plurality of light emitting diode (LED) chips within the porous template, with the compound semiconductor layers being formed of quantum dots by injecting nano particles or nano particle precursors into the pores together with impurities;
   hydrophilically treating surfaces of the porous template exposing ends of the LED chips;
   releasing the LED chips from the pores in the porous template by removing the porous template with an etchant;
   forming a plurality of first electrodes on a substrate;
   attaching the LED chips to pixel sites on the first electrodes during fluidic self assembly (FSA); and
   forming a plurality of second electrodes on top surfaces of the LED chips.

2. The method of claim 1, comprised of forming the substrate from a glass substrate or a plastic substrate.

3. The method of claim 1, comprised of forming grooves having predetermined depths at locations corresponding to the pixel sites of the first electrodes on the substrate.

4. The method of claim 1, comprised of forming at least one of the first and second electrodes from a transparent and electrically conductive material.

5. The method of claim 1, comprised of aligning the second electrodes to cross the first electrodes.

6. The method of claim 5, comprised of forming the first and second electrodes are formed as longitudinally extended stripes.

7. The method of claim 1, comprised of creating the pores with diameters with a range of between approximately 1 nm and 100 µm.

8. The method of claim 1, comprised of forming the porous template from one of anodized aluminum oxide or porous glass fiber.

9. The method of claim 1, comprised of using a buffered oxide etchant to remove the porous template.

10. The method of claim 1, after forming the first electrodes on the substrate, further comprising:
    hydrophobically treating the pixel sites on the first electrodes; and
    applying an adhesive to the hydrophobically treated pixel sites.

11. The method of claim 10, comprised of applying the adhesive to the pixel sites on the first electrodes when the substrate on which the first electrodes are formed, is soaked in a hydrophobic adhesive solution.

12. The method of claim 10, wherein attaching the LED chips with FSA comprises:
    inserting the LED chips and the substrate bearing the first electrodes into an aqueous solution held in a container; and
    attaching one end of the LED chips having a hydrophobic property to the pixel sites on the first electrodes bearing the adhesive by subjecting the container to vibrations.

13. The method of claim 12, further comprised of thermally pressurizing the LED chips attached to the pixel sites on the first electrodes.

14. The method of claim 1, further comprised of after attaching the LED chips, repairing the pixel sites of the first electrodes to which the LED chips are not attached.

15. The method of claim 14, wherein the repairing of the pixel sites comprises repeatedly performing FSA.

16. The method of claim 14, wherein the repairing of the pixel sites comprises separately attaching the LED chips to each of the pixel sites on the first electrodes to which the LED chips are not attached.

17. A method of manufacturing a display device, the method comprising:
    forming a porous template by creating an array of pores having selected sizes;
    stacking impurity-doped compound semiconductor layers inside corresponding ones of the pores and forming light emitting diode chips by sintering the semiconductor layers, with the compound semiconductor layers being formed of quantum dots by injecting nano particles or nano particle precursors into the pores together with impurities;
    hydrophilically treating top surface ends of the light emitting diode chips exposed by one surface of the porous template;
    releasing the light emitting diode chips from the pores;
    forming a plurality of first electrodes on a substrate;
    attaching the light emitting diode chips to pixel sites on the first electrodes during fluidic self assembly; and
    forming a plurality of second electrodes on the top surface ends of the LED chips.

18. A method of manufacturing a display device, the method comprising:
    forming a porous template by creating an array of pores having selected sizes;
    sequentially forming n-type and p-type compound semiconductor layers inside corresponding ones of the pores by injecting nano particles or nano particle precursors into the pores with different impurities and forming light emitting diode chips by sintering the semiconductor layers, with the compound semiconductor layers being formed of quantum dots;

endowing base surface ends of the light emitting diodes with hydrophobic properties and endowing top surface ends of the light emitting diode chips with hydrophilic properties by hydrophilically treating the top surface ends exposed by one surface of the porous template;

releasing the light emitting diode chips from the pores;

forming a plurality of first electrodes on a substrate;

hydrophobically treating the pixel sites formed on the first electrodes;

applying an adhesive to the hydrophobically treated pixel sites; and attaching the base surface ends of the LED chips to the pixel sites on the first electrodes during fluidic self assembly (FSA).

* * * * *